United States Patent [19]

Redfield

[11] Patent Number: 5,529,861
[45] Date of Patent: Jun. 25, 1996

[54] METHOD FOR ENHANCING THE UTILITY OF A PHOTOPOLYMER RECORDING MEDIA FOR HOLOGRAPHIC DATA RECORDING

[75] Inventor: Stephen R. Redfield, Austin, Tex.

[73] Assignee: Tamarack Storage Devices, Austin, Tex.

[21] Appl. No.: 217,255

[22] Filed: Mar. 24, 1994

Related U.S. Application Data

[60] Division of Ser. No. 139,284, Oct. 19, 1993, Pat. No. 5,377,179, which is a continuation-in-part of Ser. No. 91,311, Jul. 14, 1993, Pat. No. 5,372,176.

[51] Int. Cl.$^6$ ............................................. G03H 1/26
[52] U.S. Cl. ......................... 430/1; 430/394; 430/2; 430/290; 359/1; 359/10; 359/11
[58] Field of Search ................. 359/1, 3, 11, 10; 430/1, 2, 290, 394

[56] References Cited

U.S. PATENT DOCUMENTS

| | | |
|---|---|---|
| 3,635,538 | 1/1972 | Caulfield et al. . |
| 3,667,946 | 6/1972 | Sturdevant ..................... 359/3 |
| 3,694,218 | 9/1972 | Margerum et al. ............. 430/1 |
| 3,711,177 | 1/1973 | Ward ............................ 359/11 |
| 3,807,828 | 4/1974 | Johnson et al. ............... 359/10 |
| 3,912,391 | 10/1975 | Fleisher et al. . |
| 3,993,485 | 11/1976 | Chandross et al. ............ 430/1 |
| 4,063,795 | 12/1977 | Huignard et al. . |
| 4,076,370 | 2/1978 | Wako . |
| 4,307,165 | 12/1981 | Blazey et al. .................. 430/8 |
| 4,334,007 | 6/1982 | Tinet et al. .................. 430/270 |
| 4,362,806 | 12/1982 | Whitmore .................... 430/202 |
| 4,687,720 | 8/1987 | Wreede et al. ................ 430/1 |
| 4,799,746 | 1/1989 | Wreede ......................... 430/1 |
| 4,942,112 | 7/1990 | Monroe et al. ................ 430/1 |
| 4,950,567 | 8/1990 | Keys et al. .................... 430/1 |
| 4,983,003 | 1/1991 | Wreede et al. ................ 359/1 |
| 5,007,690 | 4/1991 | Chern et al. . |
| 5,095,375 | 3/1992 | Bolt ............................. 359/1 |
| 5,098,176 | 3/1992 | Wolf ............................ 359/11 |

FOREIGN PATENT DOCUMENTS

| | | | |
|---|---|---|---|
| 63-306486 | 12/1988 | Japan .......................... 359/3 |
| 5-113741 | 5/1993 | Japan .......................... 430/2 |

OTHER PUBLICATIONS

Parish, Tom, "Crystal Clear Storage," *Byte*, Nov. 1990, pp. 283–288.

Primary Examiner—Charles L. Bowers, Jr.
Assistant Examiner—M. Angebranndt
Attorney, Agent, or Firm—Gregory M. Howison

[57] ABSTRACT

A holographic storage media (10) is fabricated from a thin layer of photopolymer recording media. The photopolymer recording media is disposed between a substrate (48) and a capping layer (56). The media (10) is divided into a plurality of storage regions (54), which are formed within wells (52) to isolate each of the regions (54). During a record operation, a pumping operation is first performed to remove oxygen molecules from the media by bombarding the select region that is to have an interference pattern recorded therein with photons for a predetermined duration of time. Once the oxygen molecules have been depleted, then a data beam is generated with data superimposed thereon and a reference beam generated for interference with the data beam in the storage region (54). This results in the recording of an interference pattern.

13 Claims, 5 Drawing Sheets

FIG. 10

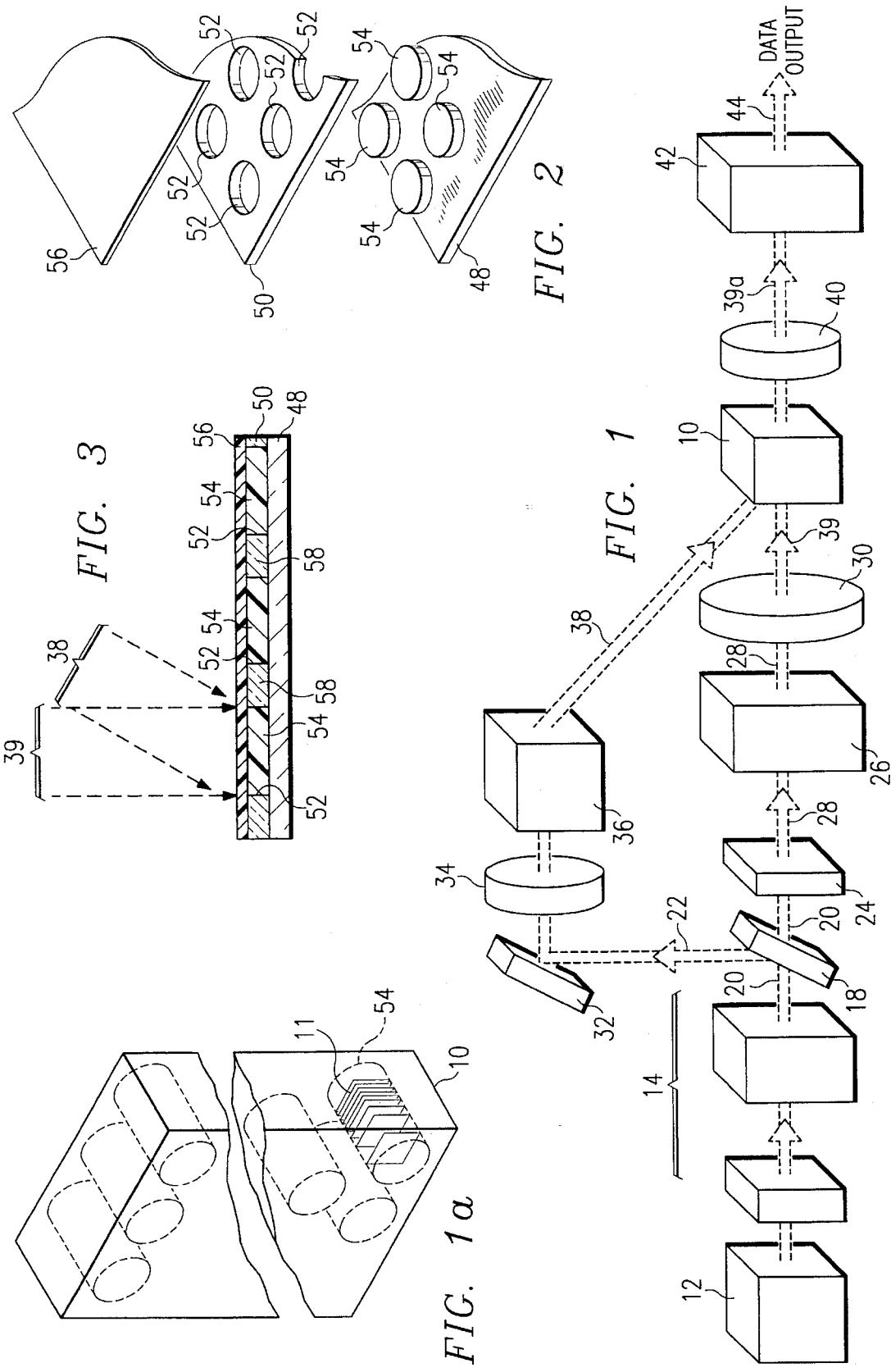

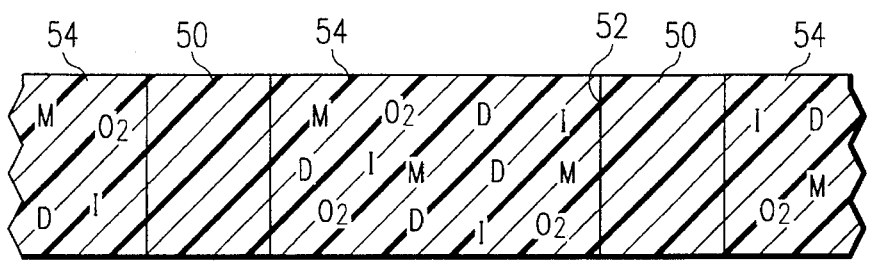
FIG. 4
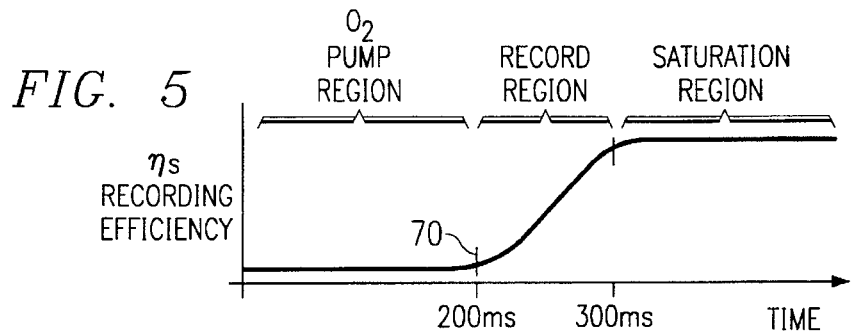
FIG. 5
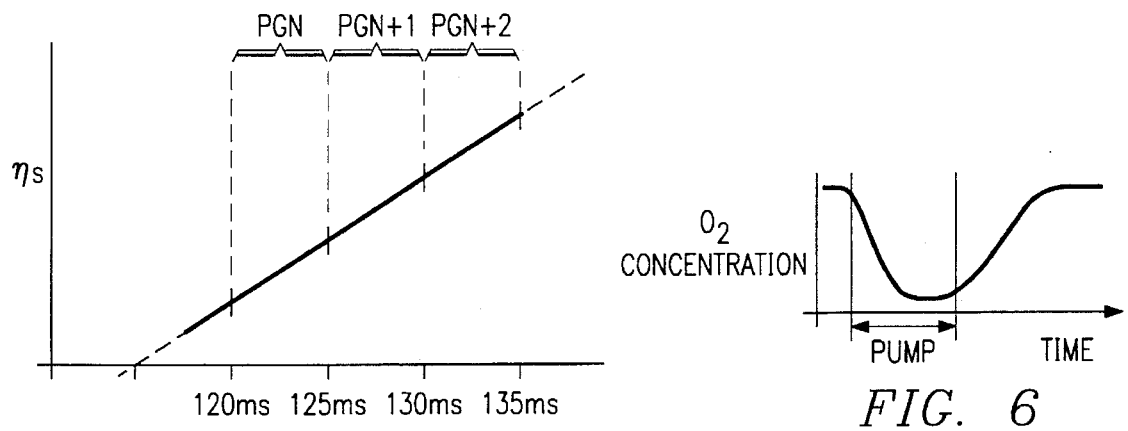
FIG. 5a
FIG. 6
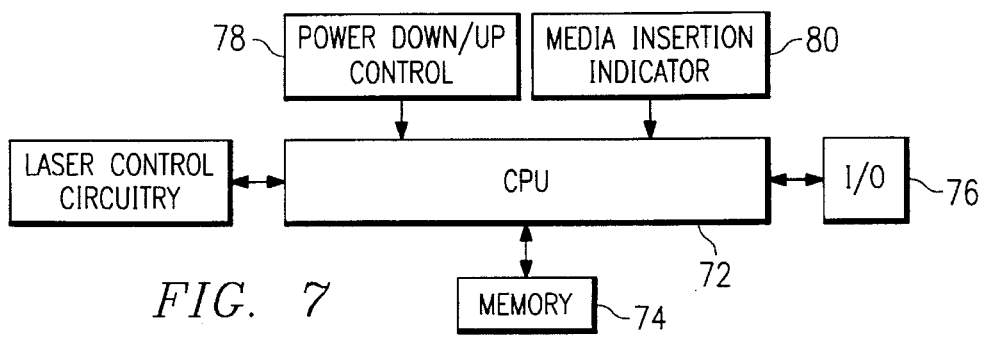
FIG. 7

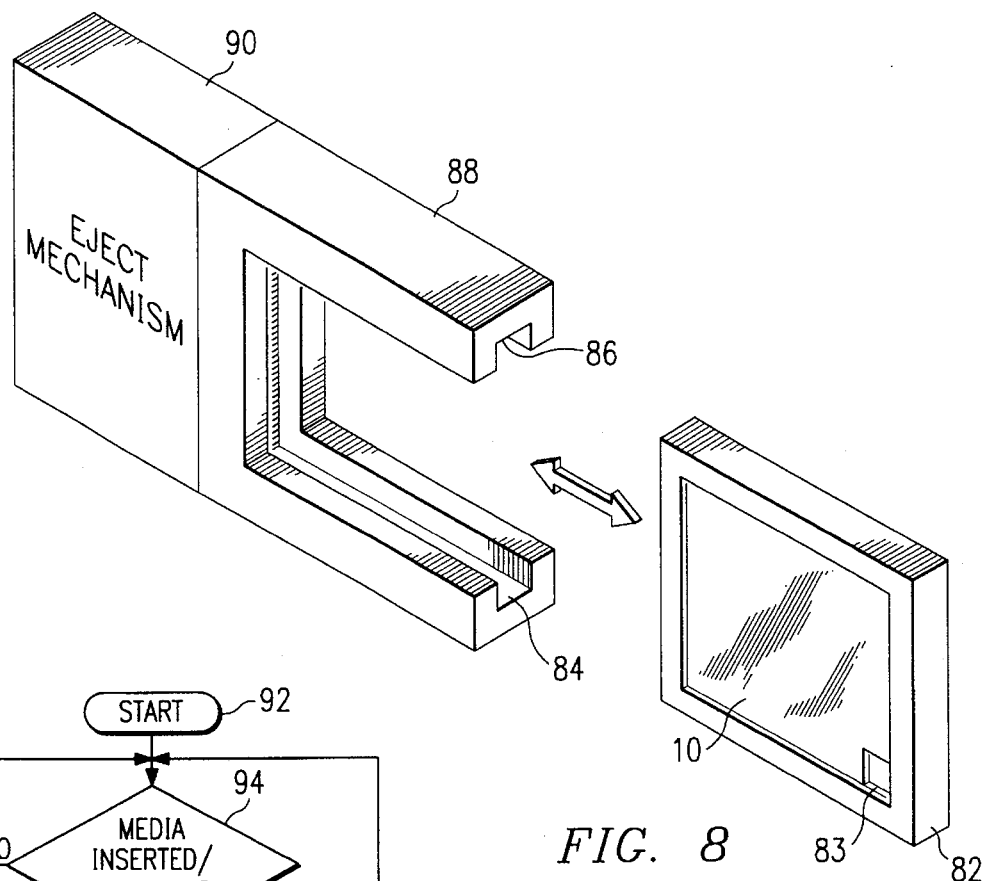
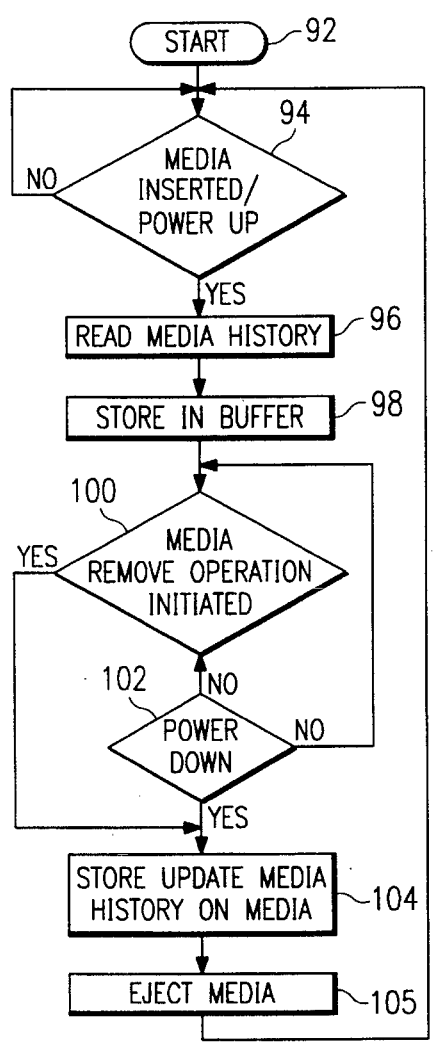
FIG. 8
FIG. 9

METHOD FOR ENHANCING THE UTILITY OF A PHOTOPOLYMER RECORDING MEDIA FOR HOLOGRAPHIC DATA RECORDING

CROSS REFERENCE TO RELATED APPLICATIONS

This application is a divisional of U.S. Ser. No. 08/139,284, filed Oct. 19, 1993 issued Dec. 27, 1994 (Atty. Dkt. No TAMA-22,389), entitled "Method and Apparatus for Enhancing the Utility of a Photopolymer Recording Media for holographic Data Recording," which is a continuation-in-part of U.S. patent application Ser. No. 08/091,311, entitled "Method and Apparatus for Isolating Data Storage Regions in a Thin Holographic Storage Media", filed Jul. 14, 1993 now U.S. Pat. No. 5,377,176, issued Dec. 27, 1994. (Atty. Dkt. No. TAMA-21,817).

TECHNICAL FIELD OF THE INVENTION

The present invention pertains in general to holographic memories, and more particularly, to the technique-for removing oxygen from the holographic storage media utilizing a thin photopolymer media prior to recording of information therein.

BACKGROUND OF THE INVENTION

As the need for increased data storage changes, the search for higher density, faster access memory technologies also increases. One of these, holographic data storage, provides the promise for increased access to higher density data. The techniques for realizing such storage typically utilize some type of storage media, such as photorefractive crystals or photopolymer layers, to store 3-D "stacks" of data in the form of pages of data. Typically, coherent light beams from lasers are utilized to perform the addressing, writing and reading of the data from the storage media by directing these beams at a specific region on the surface of the media. Writing is achieved by remembering the interference pattern formed by these beams at this region. Reading is achieved by detecting a reconstructed light beam as it exits the storage media, the data then being extracted therefrom. Addressing is achieved by the positioning of the laser beams, and this is typically done through the mechanical movement of mirrors or lenses; however, the storage media itself can be moved relative to fixed laser beams.

One storage media that is utilized for storage of information in the form of an interference pattern is a photopolymer material. This material is typically utilized to form conventional holograms. When initially fabricated, this photopolymer material is comprised of a thin layer of photopolymer disposed on some type of transparent substrate. A capping layer of a material, such as Mylar®, is then disposed over the photopolymer layer. Initially, the photopolymer layer will have a large amount of unpolymerized monomers, a large amount of dye and initiators. The normal polymerization procedure is to irradiate the photopolymer with photons which will then begin the polymerization process. The reaction sequence associated with this process is complex. A simplified, but reasonably good model is as follows: the dye is first exited by photons and then the excited dye transfers energy to the initiator to provide an exited initiator. The excited initiator then combines with a monomer, which begins a chain reaction where initiator combinations combine with additional monomers to result in larger combinations, and so on, yielding a polymer. However, when oxygen is present in the photopolymer material, the excited initiator, instead of combining with the monomer, will combine with the oxygen, resulting in a termination step. If there is sufficient oxygen in the photopolymer material, the polymerization procedure will not rise to an acceptable level for a record operation until the available oxygen is consumed by initiators. This presents a problem in that oxygen is a relatively common molecule in the environment in which the photopolymer exists and readily diffuses through the photopolymer material. Therefore, if a particular region of the photopolymer is irradiated to a sufficient extent to remove the oxygen through combination with excited initiators, oxygen from an adjacent region of the photopolymer could diffuse into the irradiated region at a later time, thus requiring oxygen to be removed each time a recording is made in a particular region.

The ideal holographic storage media is inert to light until such time as one wishes to record, and then it becomes quite sensitive. Ideally, something simple can be done to the media at this time to make it sensitive. The oxygen in the photopolymer provides such a mechanism, and if used innovatively, can make photopolymer an ideal storage media.

SUMMARY OF THE INVENTION

The present invention disclosed and claimed herein comprises a method and apparatus for recording an interference pattern in a photopolymer recording media. The method includes the step of first irradiating the photopolymer layer for a predetermined amount of time to deplete free oxygen from the photopolymer material such that additional irradiation of the photopolymer material will result in substantially more polymerization than oxygen depletion. Thereafter, an interference pattern is recorded in a select region in the photopolymer material by interfering a data beam and a reference beam for a predetermined record duration of time to create the interference pattern. By employing this technique, the photopolymer media can be made very sensitive during recording, allowing multiple recordings to be done in quick succession. This technique also permits the photopolymer media to be relatively insensitive until the desired record time.

In another aspect of the present invention, an irradiation history for each of the storage regions is stored in a memory. This irradiation history defines the amount of time elapsed between the time that oxygen was depleted from the storage region and a subsequent record operation. Media parameters are also stored to define the diffusion rate of oxygen into the photopolymer material as a function of time. The irradiation operation is then controlled such that it will only be performed in accordance with the irradiation history to deplete only the amount of oxygen diffused since the last irradiation operation for a subsequent recording relative thereto.

In yet another aspect of the present invention, after a given storage location has been fully recorded, the storage location is light cured. This is accomplished by illuminating the storage location with light for a sufficient amount of time to deplete all unused constituents of the polymerization process. Thereafter any light that impinges the storage region will not cause any changes thereto.

BRIEF DESCRIPTION OF THE DRAWINGS

For a more complete understanding of the present invention and the advantages thereof, reference is now made to the following description taken in conjunction with the accompanying Drawings in which:

FIG. 1 illustrates an overall block diagram of a holographic storage assembly;

FIG. 1a illustrates a detail of the recording media;

FIG. 2 illustrates an exploded view of one embodiment of the present invention illustrating the perforated structure that forms the isolation structure in which photopolymer material is disposed, the perforations defining the recording regions;

FIG. 3 illustrates a cross-sectional view of the structure of FIG. 2 after assembly thereof and with a data beam and a reference beam impinging on the surface thereof;

FIG. 4 illustrates a cross-sectional diagram of the holographic storage media illustrating the concentration of monomers, dyes, initiators and oxygen;

FIG. 5 illustrates a graph of recording efficiency as a function of time;

FIG. 5a illustrates a detail of the linear region of the efficiency curve of FIG. 5;

FIG. 6 illustrates a graph of oxygen concentration as a function of time;

FIG. 7 illustrates a block diagram of the control system of the present invention;

FIG. 8 illustrates a media insertion device;

FIG. 9 illustrates a flowchart depicting the overall operation of reading the media history from the media and writing the media history to the media;

DETAILED DESCRIPTION OF THE INVENTION

Figure 10:
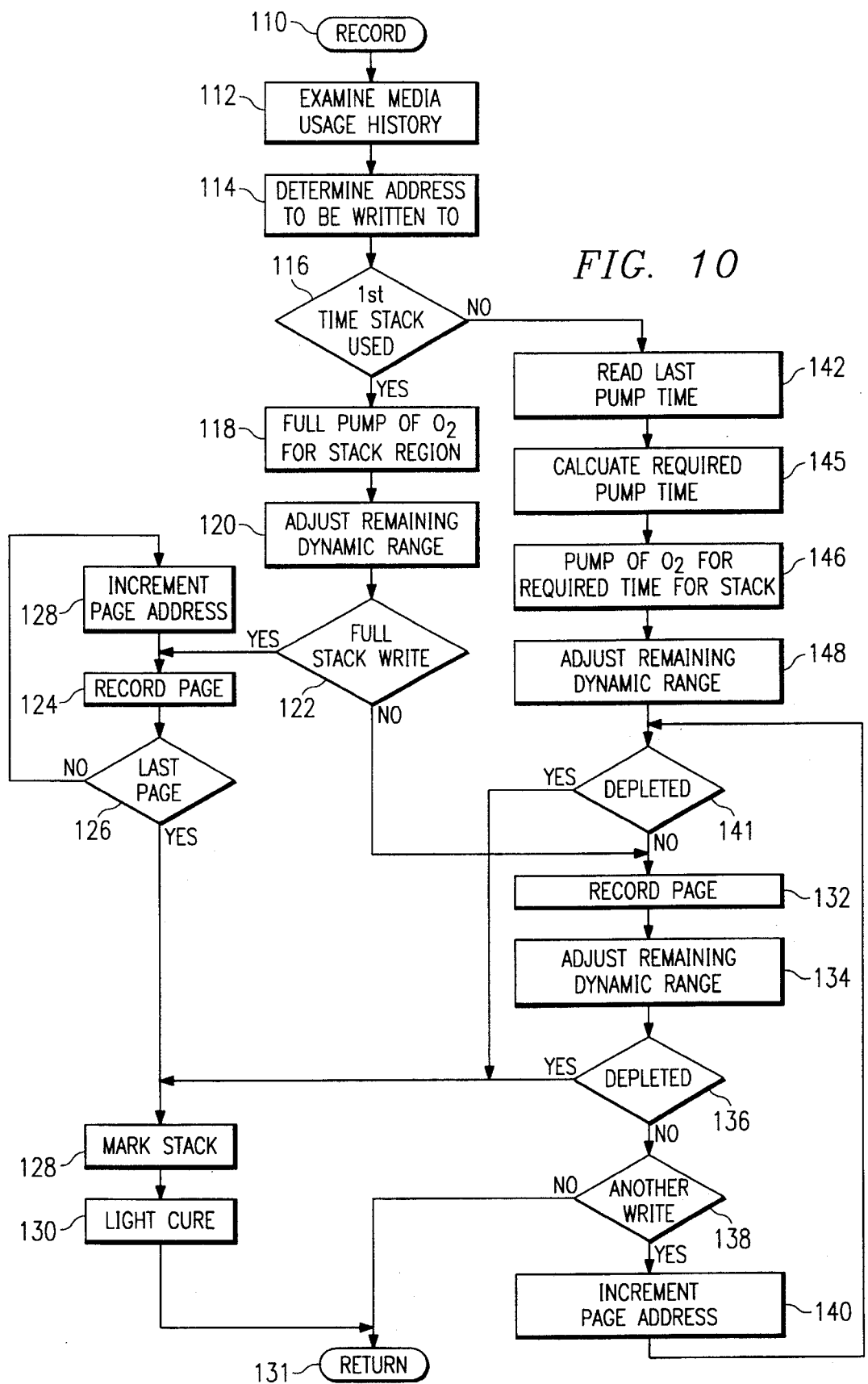
FIG. 10 illustrates a flowchart depicting the record operation.

Referring now to FIG. 1, there is illustrated a holographic storage assembly which is operable to store data in a transparent holographic storage recording media 10 and extract that data therefrom. The data is organized in the recording media as an array of stacks of pages 11 (images). This is illustrated in FIG. 1a, wherein each of the stacks of pages 11 occupies a small region 54 of the recording media 10, with each of the pages in each of the regions 54 comprising an interference grating, all of the interference gratings in a given region 54 superimposed over each other. A laser 12 is provided, which can be comprised of, for example, a diode-pumped YAG (yttrium aluminum garnet) laser with a power output of around 80 milliwatts, with a wavelength in the range of 532 nanometers. The output beam of the laser is processed by a stack-selector assembly 14 which steers the beam to the location of an individual stack of pages 11 in the recording media 10. The output of the stack selector assembly 14 is then passed to a beam splitter 18 which separates the beam into two beams, a data beam 20 and a reference beam 22.

The data beam 20 is expanded by a beam expander 24 which is then input to a Spatial Light Modulator (SLM) 26 to output an expanded data beam 28. The SLM 26 receives data from a computer system (not shown) and then this data is superimposed on the expanded data beam 28 by the SLM 26, creating a bit pattern of light and dark spots in the conventional manner. This pattern of spots represents the bits on the page to be stored. After the SLM 26, the data beam is then passed through a focusing system 30 which then focuses the beam onto a select portion of the surface of the holographic storage media 10. This focused data beam 39 is the Fourier transform of the pattern of spots, or page.

The reference beam 22 is reflected from a mirror 32 and then passed through a polarization rotator 34, the polarization orientation dictated by an external control signal. This rotator is utilized to adjust the polarization of the reference beam 22 during a read operation. The output of the polarization rotator 34 is then input to a page addressing deflector system 36 system which defines the angle at which the reference beam will impinge the surface of the recording media 10 and also the location thereof on the surface of the recording media 10.

This is represented by a deflected reference beam 38.

As the two beams, the data beam and the reference beam, enter the recording media 10, the reference beam interferes with the data beam, writing an interference grating in the storage media 10. In the case of a photorefractive material, the grating pattern results from a stored electronic-charge pattern that modifies the optical properties of the crystallite. In the case of photopolymer material, certain areas of the photopolymer material are polymerized to form the interference grating. The result is a 3-D holographic image of the Fourier transform of the bit pattern carried in the data beam. This stored interference grating allows the original data beam to be recreated when the system reads the data. This process on which the interference grating is formed on the recording media 10 is basically the Write process for a holographic storage material.

The Write process is repeated a number of times, with the angle of the reference beam operable to be changed each time, to record a plurality of interference gratings. Each of the interference gratings is associated with a different input bit pattern, which interference gratings are superimposed over each other. This collection of superimposed recordings is called a stack. The recordings that comprise each of the stacks are angularly multiplexed within each of the stacks.

During a Read cycle, the data beam is shut off so that only the deflected reference beam 38 is input to the storage media 10 at the appropriate angle and location. The angle is determined by the desired page in that particular stack. The deflected reference beam 38 will be constructively diffracted by the interference grating that was recorded with a particular underlying spatial frequency that corresponds to the deflected reference beams particular angle. This results in a reconstructed image of the original bit pattern that stored there with a reference beam with that particular angle. The diffracted reference beam 39, or reconstructed data beam, then passes through the storage media 10 into a focusing system 40 which focuses the reconstructed image onto the surface of a detector array 42 of, for example, a charge-coupled device that captures the reconstructed light and dark bit patterns of the image and then convert them back to digital electronic signals for transfer to a computer. This is represented by a data output line 44.

Referring now to FIG. 2, there is illustrated an exploded view of one embodiment of the storage media 10. The storage media of FIG. 2 utilizes a photopolymer, which photopolymer is a material that undergoes photo-induced polymerization. These compositions have been used to form conventional holograms. These are typically fabricated from a viscous or gelatin-like composition which is photo-reactive. When two laser beams intersect in this composition to set up an interference pattern, this causes selective polymerization within the material. These compositions typically contain a polymeric binder, a liquid ethylinically unsaturated monomer and a photoinitiator system. Typically, the layer of viscous or gelatin-like recording material is spun-or web coated onto a substrate such as glass to provide a thin coating of approximately 20 microns. A capping layer of material such as Mylar® is then disposed over the gelatin layer. This provides a relatively good optical surface on the upper surface of the gelatin layer, and the glass substrate provides a high quality optical surface on the bottom surface of the gelatin-like recording layer.

Returning to FIG. 2, an optically transmissive substrate 48 is provided over which an optically isolating perforated structural member 50 is disposed. The structural member 50 has a plurality of defined openings or wells 52 disposed therein, which wells 52 contain data storage regions 54. Each of the data storage regions 54 is separated from the other data storage region 54 by a predetermined distance. The structural member 50 is fabricated from a non-polymerizable material which is approximately 20 microns thick. In the preferred embodiment, the wells 52 are circular regions which are approximately equal to the diameter of the laser beam that impinges on the surface when reading or writing data to the storage media. The wells 52 are-each operable to receive a storage area 54 of photopolymer material. An upper capping layer of Mylar® 56 is provided.

Referring now to FIG. 3, there is illustrated a cross-sectional diagram of the assembled structure of FIG. 2. It can be seen that each of the wells 52 is arranged to hold photopolymer material that forms the data storage regions 54. The photopolymer material is therefore confined within the wells 52 and separated from adjacent storage regions 54 by the portion of the structure 50 that separates the wells 52. This is represented by the space 58 between each of the photopolymer material storage regions 54. When the data beam 39 and reference beam 38 are properly adjusted, they will impinge upon the surface and be aligned with respect to the surface of a select one of the photopolymer storage regions 54. This results in a number of benefits. First, the light is confined within the regions, since the index of refraction of the structure 50 and the photopolymer material in the isolated storage regions 54 is different. Second, since the isolated regions 54 are not in contact, monomer and oxygen diffusion between regions is reduced. Thirdly, an increased structural rigidity is provided for a given region 54 such that a thicker layer of photopolymer can be accommodated. In general, with a large monolithic surface area layer, the thickness of the photopolymer must be limited due to the instability of the material, since it is in a gelatin state. However, the spaces 58 provide isolation and reduce the fluid motion of the polymer to accommodate a thicker layer, it being noted that the photopolymer material is a viscous material.

Referring now to FIG. 4, there is illustrated-a cross-sectional diagram of the wells 52 of the media described above with respect to FIG. 2. As described above, each of the wells 52 contains a photopolymer material in the form of a storage region 54. In a simplified, but reasonably accurate view, which is a good model for describing the aspects of the invention, each of the storage regions 54 have photopolymer material disposed therein which has associated therewith a plurality of monomer molecules (M), a plurality of initiator molecules (I) and a plurality of dye molecules (D). In addition, there are a plurality of $O_2$ molecules that are not initially introduced to the material but diffused there due to the exposure of the material to the atmosphere. The walls formed by the structure 50 that are disposed between adjacent regions 54 are either unpolymerized material that is different from the photopolymer material or, completely polymerized photopolymer material. In any event, the portions of the structure 50 between adjacent regions 54 substantially inhibit diffusion of $O_2$ molecules therebetween.

The reaction that initiates polymerization is a photo induced one. Therefore, photons must be introduced into the storage region 54 to initiate the operation. A simplified, but reasonably accurate view, which is a good model for describing the invention, is as follows: the operation is initiated by first combining a photon with a dye molecule to provide an excited dye molecule (D*) as follows:

$$D+\gamma \rightarrow D^* \tag{1}$$

The formation of the excited dye molecule is followed by transfer of the excited state to an initiator molecule as follows:

$$D^*+I \rightarrow D+I^* \tag{2}$$

When the excited initiator is formed, this will initiate the formation of the monomer which is initially started by the combination of the excited initiator molecule (I*) and a monomer molecule (M), which results in an initiator-monomer combination (IM). This reaction is continued by adding monomers to the molecules to form a polymer $IM^{N+1}$. This is illustrated as follows:

$$I^*+M \rightarrow IM \tag{3}$$

$$IM+M \rightarrow IM^2 \tag{4}$$

$$IM^n+M \rightarrow M^{n+1} \tag{5}$$

Whenever oxygen molecules are present, the excited initiator molecule (I*) will have a tendency to combine with the oxygen molecule to form a combination $IO_2$ as follows:

$$I^*+O_2 \rightarrow IO_2 \tag{6}$$

This is a terminating operation, which will use up the excited initiator molecule. As long as oxygen is present, the initiator molecules that are needed to initiate the polymerization process will be depleted.

Referring now to FIG. 5, there is illustrated a graph of recording efficiency ($\eta_s$) versus time. Initially, there is no polymerization due to the presence of the $O_2$ molecules. Therefore, as the media is irradiated, the presence of the oxygen will inhibit the formation of polymers. At some point, the oxygen is effectively used up and polymerization becomes the dominant process. It takes a finite amount of irradiation to accomplish this. One can expose the photopolymer to this amount of irradiation before the data to be recorded is available. This prepares the photopolymer, or "pumps" it, such that when data is available all the light exposure results in polymerization. For this reason, this region on the graph is referred to as the "$O_2$ pump region". Whenever the oxygen is used up, then the polymerization procedure will begin and allow interference patterns to be recorded. This begins at a point 70. Polymerization will then continue until a saturation region is reached. When the saturation region is reached, there will no longer be polymerization due to the fact that either the dye molecules, monomer molecules, or initiator molecules are used up and the reaction can no longer continue.

As will be described hereinbelow, the present invention is directed toward a method and apparatus whereby the region 54 in which information is to be stored is "pumped" prior to initiating a record operation. This pumping operation basically removes or depleats the $O_2$ and prepares the photopolymer for immediate data recording.

Referring now to FIG. 5a, there is illustrated a more detailed view of the graph in FIG. 5 which illustrates how the total dynamic range of the material is divided up as each page of information is stored in the recording material. Once the point 70 has been reached, polymerization can proceed. However, once polymerized, the procedure cannot be traversed. Therefore, each page of recording will utilize a predetermined amount of polymers in the polymerization process. This, of course, is a function of how long the region is irradiated during a record operation. Since the record operation is the result of the interference of a reference beam and a data beam with dam superimposed thereon, it is only necessary to maintain the reference beam and data beam in the interference condition for a sufficient amount of time to form an interference pattern within the storage region 54. The longer that the data and reference beam irradiate the storage region 54, the stronger the pattern. However, it has been determined that a sufficiently defined pattern will be created in approximately 2 milliseconds for a realizable set of initial conditions. In the preferred embodiment, this includes beam diameters of approximately 1 mm and beam intensities of approximately 5 milliwatts. This will, of course, vary for different photopolymer compositions, but these conditions will work with typical photopolymer sensitivities. Given these conditions, it takes approximately 200 milliseconds to completely pump the $O_2$ out of the storage region 54 and it takes approximately 300 milliseconds to reach the saturation region, there are approximately 100 milliseconds during which a polymerization procedure can take place. If it takes approximately 5 milliseconds for each page of information to be stored, then 20 pages of information can be stored in storage region 54. Of course, if the dynamic range of the photopolymer were greater such that the polymerization process lasted longer, more pages of information could be stored therein. However, once all of the monomers are used up, no additional information can be written to or stored in the storage region 54.

As will be described hereinbelow, one method of writing to a given storage region 54 is to pump the oxygen out of the storage media by irradiating of the storage media for approximately 100 milliseconds and then sequentially writing 20 pages of information into the storage media and doing a Read/Verify operation thereafter to ensure that all information was written to the memory.

Referring now to FIG. 6, there is illustrated a graph of the $O_2$ concentration as a function of time depicting a transition from a high concentration to a low concentration after a "pump" operation. Even though the oxygen is initially depleted from the storage region 54, the $O_2$ can diffuse back into the region 54 from various sources. $O_2$ molecules can diffuse through the upper Mylar® capping layer, and they can diffuse from the adjacent regions, depending upon how permeable the support structure 50 is. Depending upon the environment, this time will vary. The system will have information stored defining media parameters associate with diffusion time, elapsed time between a recording and the next $O_2$, etc., such that information is available as to how much oxygen is present in the storage region 54. This can be achieved in one of two ways. In a first method, as described above, the region can be completely pumped free of oxygen molecules by combining them with initiators and then all desired information immediately stored in the storage region 54. Alternatively, the region can be initially pumped free of oxygen molecules and then one or more pages of information stored therein without completely using up all of the monomers. At a later time, additional information can be stored in the storage region 54, but the time between recordings must be determined and a sufficient amount of pumping then performed on the storage region to remove any oxygen that would have diffused into the storage region 54, this again being an empirical determination.

Referring now to FIG. 7, there is illustrated a schematic block diagram of the control system that controls the system to Read and Write. A microprocessor 72 is provided which is any type of central processing unit having associated therewith data and address buses and also control buses that can run the various control features. These are conventional devices. The microprocessor 72 is operable to interface with a memory 74, the memory 74 comprised of both volatile and non-volatile memory. The volatile memory is typically of the Dynamic Random Access Memory (DRAM) type and the nonvolatile memory is typically of the Static Random Access Memory (SRAM). However, there are numerous types of non-volatile memories such as EEPROM, PROM, etc. Any type of non-volatile memory can be utilized. The microprocessor 72 is also operable to interface with an input/output device 76, which allows for external interface from consoles, peripheral devices, etc. through such structures as an RS 232 protocol.

The microprocessor 72 interfaces with a power down/power up control circuit 78, which is operable to monitor the system to determine when power has been applied to or removed from the system. Typically, whenever power is applied to the system, a certain sequence is initiated in the microprocessor 72 to initialize all internal registers, etc. During a power down sequence, some systems will monitor the voltage and determine when the voltage has fallen below a predetermined level. When this occurs, a power down sequence is entered wherein certain instructions are executed by the microprocessor 72 after the resident program has been prematurely halted. In these power down sequences certain key register values and state information are stored, such that the system, upon power up, can begin execution at the point where it left off. As will be described hereinbelow, whenever a power down sequence is initiated, information regarding the history of the media is stored in a non-volatile storage region physically associated with the media. When the media is removed, it is important that this information is not lost and that it is unique to the media itself, i.e., it follows the media. A media insertion indicator 80 is provided to determine whether the media is inserted or it is being removed.

Referring now to FIG. 8, there is illustrated a diagrammatic view of a removable media structure. The media 10 is comprised of a two-dimensional flat surface that is disposed in a cassette 82. The cassette 82 is operable to be inserted along the edges thereof into slots 84 and 86 on a cassette holder 88. The cassette holder 88 is operable to interface with an eject mechanism 90. The eject mechanism 90 is operable to sense the presence of the cassette 82 within the slots 84 and 86 and also to urge the media 82 outward from the slots 84 and 86 in response to an eject command. Whenever the eject command is generated, this provides an indication to the microprocessor 72 that a Write operation is to be performed to a predetermined addressable location on the media 10 associated with the history of the media and each of the storage regions thereon. This is necessary since the amount of monomer molecules remaining in any one of the given regions cannot be measured and-must be determined from "prior use," this determined from the history as to which of the regions has been pumped, which of the regions has been written to, and how many pages of information have been written to each of the regions. Although not illustrated, some other type of nonvolatile memory could be associated with the cassette 82 such as an EEPROM. This would be a Read/Write memory which could be written to each time a Write operation was performed on the media 10.

Referring now to FIG. 9, there is illustrated a flowchart depicting the operations associated with maintaining the irradiation history of a given media. The program is initiated at a block 92 labeled "History" and then flows to a decision block 94 to determine whether the media has been inserted or a power up operation has been initiated. Whenever the media has been removed or the power down sequence has been completed, the program will flow along the "N" path back to the input of the decision block 94. When the media is inserted or a power up operation has occurred, the program will flow along a "Y" path to a function block 96 to read the media history. The media history will be read from the media itself to determine which of the storage regions 54 have not been written to or which the regions have been partially written to, such that the system will then have information as to the available storage locations and also as to the amount of time that has elapsed since the last record operation for a given region. As described above, the media history for insertion of a new cassette 82 must be stored in conjunction with the cassette 82. However, for a power down operation, the media history could have been stored in a separate non-volatile memory prior to or during power down operation, or the media history could be written to the media 10 in the cassette 82.

After the media history has been read as indicated in function block 96, the program then flows to a function block 98 to store the media history in an internal buffer in the memory 74. This typically is comprised of a volatile storage register. The program then flows to a decision block 100 to determine whether a media remove operation has been initiated. If not, the program flows along an "N" path to a decision block 102 to determine if a power down operation has occurred. If not, the program flows along an "N" path back to the input of decision block 100. If a power down condition has occurred, the program will flow from decision block 102 along a "Y" path to a function block 104 and, if a media remove operation has been initiated, the program will flow along a "Y" path from decision block 100 to the function block 104. The function block 104 is operable to store the updated media history on the media itself. Then the media is ejected, as indicated by a block 105. The program will then flow back to the input of decision block 94 to wait for the media to be reinserted or for a power up operation to be initiated.

Referring now to FIG. 10, there is illustrated a flowchart depicting the record operation. The program is initiated at a start block 110, labelled "Record". The program then flows to a function block 112 to examine the media usage history. As described above, this is the unique history that is associated with each storage media, and which media is nonvolatile storage. The program then flows to a function block 114 to determine the address that is to be written to. Although not described in detail herein, the system is capable of addressing each storage location, each storage location on the media having a unique address. By inputting the address to the system, the reference beam and data beam can be directed to that location by either moving the media or utilizing optics to direct the reference beam and data beam.

Once the storage location to be written to is determined by its address, the program then flows to a decision block 116 to determine if this is the first time that the stack has been utilized, i.e., no data has been previously written to the associated storage location. If so, the program flows along the "Yes" path to a function block 118 to perform a full "pump" operation for the stack region. As described above, this entails illuminating the region with a laser beam for a predetermined amount of time to remove excess $O_2$. The program then flows to a function block 120 to adjust the remaining dynamic range for a record operation to indicate that a certain amount of the dynamic range of the media has been utilized by the Write operation that is to be performed. The program will then flow to a decision block 122 to determine if the operation is a "Full Stack Write" operation wherein multiple pages of information are to be written to that stack region in a sequential and uninterrupted manner. If so, the program flows along a "Yes" path to a function block 124 to record a page of information and then to a decision block 126 to determine if this is the last page. If it is not the last page, then the program flows along a "No" path to a function block 128 to increment the page address and then back to the function block 124 to record another page of information. When the last page of information is written, the program will flow from decision block 126 along the "Yes" path to a function block 128 to mark the stack as being full and then to a function block 130 to "light cure" the stack. As will be described hereinbelow, after the stack has been fully recorded, it is "light cured" by flooding the region with light in order to deplete all unused constituents of the polymerization program. The program will then flow to a return block 131.

If the operation was not a "Full Stack Write" operation, the program will flow from the decision block 122 along the "No" path to a function block 132 to record the page of information. The program then flows to a function block 134 to adjust the remaining dynamic range for another Write operation and then flows to a function block 136 to determine if the stack is "depleted", which would indicate insufficient dynamic range for another Write operation. If it is depleted, the program will flow along a "Yes" path to function block 128 to mark the stack and then to a function block 130 to light cure the stack. However, if the stack is not depleted, the program will flow from the decision block 136 along the "No" path to a decision block 138 to determine if another Write operation is to be 25 performed. If not, the program will flow along the "No" path to the Return block 131. If another Write operation is to be performed, the program will flow from decision block 138 along the "Yes" path to a decision block 140 to increment the page address and back to the input of a decision block 141 to determine if the stack is now depleted. If so, the program will flow along the "Yes" path to the function block 128 to mark the stack and to function block 130 to light cure the stack. If it is not depleted, the program would flow along a "No" path to the decision block 132 to record the page.

If, at the decision block 116, an indication had been received that this was not the first time the stack was used, i.e., some of the dynamic range had been used up in a previous operation, the program will flow along the "No" path to a function block 142 to read the last pump time from the history associated with the media and that particular storage region. The program will then flow to a function block 145 to calculate the required amount of time necessary to "pump" the stack region in order to remove $O_2$ that had reentered the stack region. This is necessary to "sensitize" the media. The program will then flow to a function block 146 to pump the stack region for the required amount of time and then to a function block 148 to adjust the remaining dynamic range for a Write operation and then to the decision block 141 to determine if this would deplete the region. The program then proceeds as described above.

Figure 11:
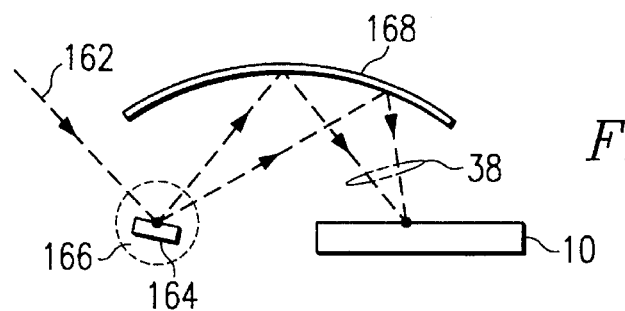
FIG. 11 illustrates a diagrammatic view of the page addressing deflection system.

Referring now to FIG. 11, there is illustrated a diagrammatic view of a page addressing system for the angle multiplexed reference beam 38. A portion of the light beam that was split off the laser beam 20 as the beam 22 is illustrated as a beam 162. This is directed onto a stepper mirror 164, which, is controlled by a stepper motor 166 to vary the angle thereof, the axis of rotation of the mirror 164 extending out of the paper. The beam 162 is operable to impinge upon the surface of the mirror 164 at its axis of rotation and reflect therefrom through a range of angles as redirected beams 166. Redirected beams 166 are directed to an elliptical reflective surface 168 which, since it is elliptical, has two foci. The reflective surface of mirror 164 is disposed at one of the foci and the media 10 surface is disposed at the other of the foci. Therefore, when the beam 162 is reflected from the surface of the mirror 164 to the elliptical reflective surface 168, it will be reflected from the elliptical surface 168 back to the other foci, which is the surface of the storage media 10. For all angles of the mirror 164, as determined by the stepper motor 166, the redirected reference beam 38 will always be redirected toward the storage location, with the only difference being the angle of incidence with respect thereto. Although not illustrated, the reflective surface 168 is elliptical in cross-section only, and so is a cylindrical optical mirror.

Figure 12:
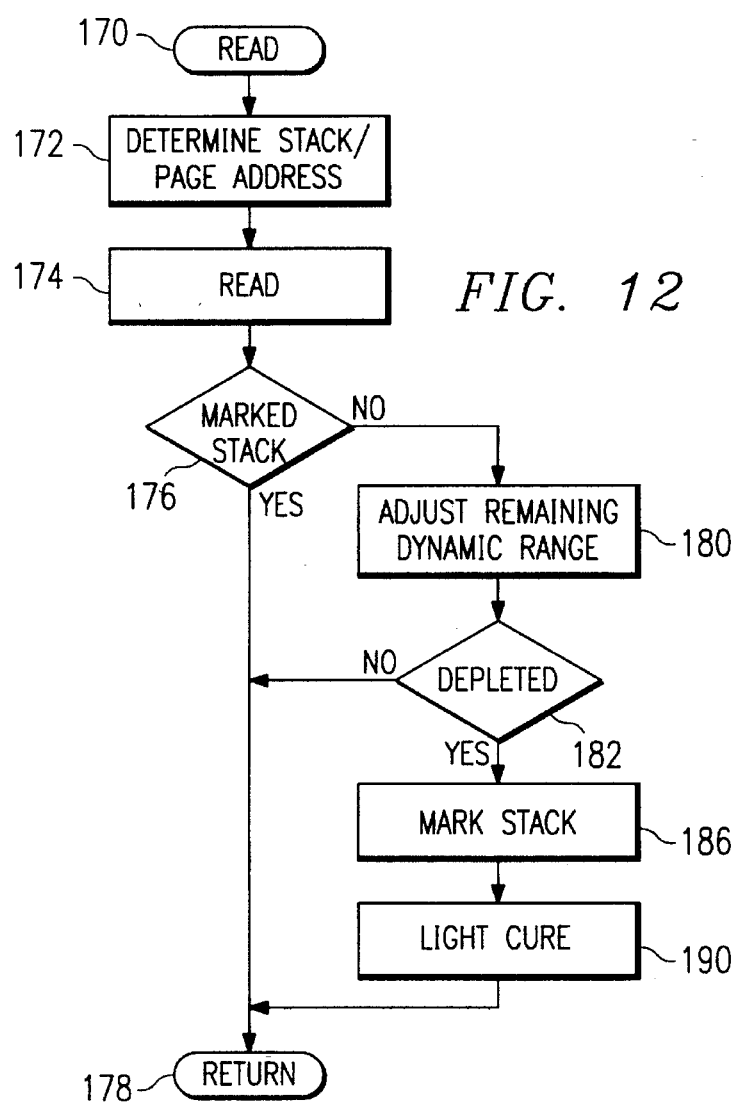
FIG. 12 illustrates a flowchart for the pumping operation and the adjustment of the dynamic range of the holographic material.

Referring now to FIG. 12, there is illustrated a flowchart depicting the operation of the overall Read function, which is initiated at a start block 170 labelled "Read". The program then proceeds to a function block 172 to determine the stack and page address and then to a function block 174 to read the information therein. The program then flows to a decision block 176 to determine if the stack has been marked as being "full." If so, the program flows along a "Yes" path to a return block 178. However, if the stack has not been marked as full, indicating that the stack had not been light cured, the program would then flow along the "No" path to the function block 180 to adjust the remaining dynamic range.

During a Read operation, it is necessary to only direct the reference beam onto the surface of the storage media for a short duration of time to generate the reconstructed data beam. This time is in the order of less than one millisecond. However, by comparison, a Write operation will take between 4–5, microseconds. As such, it can be appreciated that the Write operation will result in a significantly higher degree of polymerization of the photopolymer material as opposed to a Read operation on an un-light cured stack, which is relatively small. Since the polymerization process "depletes" the material required for polymerization, the holographic storage material is a depletable resource. As such, after a certain number of Reads and Writes occur, the photopolymer material will become "saturated." Therefore, it is necessary to maintain a record of the level of depletion that occurs.

Once the remaining dynamic range has been adjusted in the function block 180, the program then flows to a decision block 182 to determine if the stack Read has depleted the dynamic range of the stack. If not, the program flows along a "No" path to the return block 178. However, if it has been determined that the stack region has been depleted of the necessary constituents to perform the polymerization process, the program will flow along the "Yes" path to a function block 186 to mark the stack as full and store this information in the associated non-volatile memory for the media and then flow to a function block 190 to light cure the stack.

The light cure operation involves flooding the storage location for the associated stack with sufficient light energy to deplete all unused constituents of the polymerization process. In the preferred embodiment, this is accomplished by directing the reference beam at the desired storage location for approximately 200 milliseconds, twice the time required to write the entire storage location, given the intensity and beam diameter of the preferred embodiment and a typical photopolymer with a typical sensitivity. This will ensure that all constituents are depleted. After the light cure operation, the program flows to the return block 178.

In summary, there has been provided a method and apparatus for controlling the sensitivity of the recording media by removing oxygen molecules from a thin photopolymer material prior to recording an interference pattern therein. Upon the initiation of a record operation, a particular storage region is irradiated with photons to cause the oxygen molecules to be utilized by an initiator molecule in the photopolymer material. The irradiation is performed for a predetermined amount of time, after which the record operation is performed.

Although the preferred embodiment has been described in detail, it should be understood that various changes, substitutions and alterations can be made therein without departing from the spirit and scope of the invention as defined by the appended claims.

What is claimed is:

1. A method for recording an interference pattern in a photopolymer recording media having a plurality of regions defined therein in which holographic recordings are to be made, comprising:

irradiating a select one of the regions in the photopolymer recording media for a predetermined amount of time to deplete free oxygen from the photopolymer recording media such that additional irradiation of the select region of the photopolymer recording media will result in substantially more polymerization than $O_2$ depletion;

recording an interference pattern in the select region in the photopolymer recording media by interfering a data beam for a predetermined record duration with a reference beam to create the interference pattern, the recording operation effected after the step of irradiating;

storing for the select region an irradiated history as to when $O_2$ was depleted from the select region by the step of irradiating;

storing media parameters relating to the amount of $O_2$ that must be removed as a function of time prior to another recording operation taking place in the select region; and performing the irradiation operation in accordance with the irradiation history to only deplete the $O_2$ diffused since the last recording for a subsequent recording operation.

2. The method of claim 1, wherein the step of recording comprises recording a plurality of interference gratings within the select region in the photopolymer recording media by interfering a plurality of data beams each with a reference beam at a different angle to the data beam for a predetermined record duration.

3. The method of claim 1, and further comprising isolating the select region from the remainder of the photopolymer recording media to substantially reduce diffusion of $O_2$ from the remaining photopolymer region through the select region.

4. The method of claim 1, wherein the step of recording an interference pattern in the select region comprises recording one or more interference patterns each in a plurality of select regions in the photopolymer recording media.

5. The method of claim 4, and further comprising isolating each of the select regions from each other to substantially inhibit diffusion of $O_2$ therebetween.

6. A method for recording an interference pattern in a photopolymer recording media having a plurality of regions defined therein in which holographic recordings are to be made, comprising:

irradiating a select one of the regions in the photopolymer recording media for a predetermined amount of time to deplete free oxygen from the photopolymer recording media such that additional irradiation of the select region of the photopolymer recording media will result in substantially more polymerization than $O_2$ depletion;

recording one or more interference patterns in a plurality of select regions in the photopolymer recording media by interfering a data beam for a predetermined record duration with a reference beam to create the interference pattern, the recording operation effected after the step of irradiating;

storing for each of the select regions an irradiated history as to when $O_2$ was depleted from the select region by the step of irradiating;

storing media parameters relating to the amount of $O_2$ that must be removed as a function of time prior to another recording operation taking place in the select region; and performing the irradiation operation in accordance with the irradiation history to only deplete the $O_2$ diffused since the last recording for a subsequent recording operation.

7. A method for recording information in a holographic storage media with excess $O_2$ molecules present, comprising the steps of:

providing a photopolymer recording media as the holographic storage media and having associated therewith a plurality of unpolymerized monomers and excess $O_2$ and having a plurality of storage locations defined therein;

irradiating a select one of the storage locations in the photopolymer recording media for a predetermined amount of time to deplete free oxygen from the select storage location in the photopolymer recording media such that additional irradiation of the photopolymer will result in substantially more polymerization than $O_2$ depletion;

generating a data beam having data encoded therein;

generating a reference beam;

recording an interference pattern in the select location in the photopolymer media by directing the reference and data beam to the select storage location to interfere with each other for a predetermined recording duration and to form the interference pattern within the select storage location by polymerizing the photopolymer media;

storing for the select storage location an irradiated history as to when $O_2$ was depleted from the select storage location by the step of irradiating;

storing media parameters relating to the amount of $O_2$ that must be removed as a function of time prior to another recording operation taking place in the select location; and performing the irradiation operation in accordance with the irradiation history to only deplete the $O_2$ diffused since the last recording for a subsequent recording operation.

8. The method of claim 7, wherein the step of generating the data beam comprises generating a plurality of data beams each having separate data encoded therein, and the step of directing the reference and data beams comprises directing the data beam to the select storage location and directing the reference beam to the select storage location at an angle to the data beam that is different for each of the data beams such that an interference pattern is formed for each of the data beams and reference beam angles within the select storage location to provide for a plurality of pages of data.

9. The method of claim 7, wherein the step of recording comprises recording a plurality of interference gratings within the select storage location in the photopolymer recording media by interfering a plurality of data beams each with a reference beam at a different angle to the data beam for a predetermined recording duration.

10. The method of claim 7, and further comprising isolating the select storage location from the remainder of the photopolymer recording media to substantially reduce diffusion of $O_2$ from the remaining photopolymer region to the select storage location.

11. The method of claim 7, wherein the step of recording an interference pattern in the select storage location comprises recording at least one interference pattern in a plurality of select storage regions in the photopolymer recording media.

12. The method of claim 11, and further comprising isolating each of the select locations from each other to substantially inhibit diffusion of $O_2$ therebetween.

13. A method for recording information in a holographic storage media with excess $O_2$ molecules present, comprising the steps of;

providing a photopolymer recording media as the holographic storage media and having associated therewith a plurality of unpolymerized monomers and excess $O_2$ and having a plurality of storage locations defined therein;

irradiating a select one of the storage locations in the photopolymer recording media for a predetermined amount of time to deplete free oxygen from the select storage location in the photopolymer recording media such that additional irradiation of the photopolymer will result in substantially more polymerization than $O_2$ depletion;

generating a data beam having data encoded therein;

generating a reference beam;

recording at least one interference pattern in a plurality of select storage locations in the photopolymer recording media by directing the reference and data beam to the select storage location to interfere with each other for a predetermined recording duration and to form the interference pattern within the select storage location by polymerizing the photopolymer media;

storing for each of the storage regions an irradiated history as to when $O_2$ was depleted from the select storage location by the step of irradiating;

storing media parameters relating to the amount of $O_2$ that must be removed as a function of time prior to another recording operation taking place in the select storage location; and performing the irradiation operation in accordance with the irradiation history to only deplete the $O_2$ diffused since the last recording for a subsequent recording operation.

* * * * *

UNITED STATES PATENT AND TRADEMARK OFFICE
CERTIFICATE OF CORRECTION

PATENT NO. : 5,529,861

DATED : June 25, 1996

INVENTOR(S) : Stephen R. Redfield

It is certified that error appears in the above-indentified patent and that said Letters Patent is hereby corrected as shown below:

Column 1, line 13, replace "holographic" with --Holographic--.

Column 6, equation (5), replace "$IM^n + M \rightarrow M^{n+1}$" with --$IM^N + M \rightarrow M^{N+1}$--.

Column 10, line 44, delete "25".

Column 11, line 35, insert a period following "full".

Signed and Sealed this

Twenty-fourth Day of September, 1996

BRUCE LEHMAN

*Attest:*

*Attesting Officer*     *Commissioner of Patents and Trademarks*